US006445191B1

(12) United States Patent
Trummer

(10) Patent No.: US 6,445,191 B1
(45) Date of Patent: Sep. 3, 2002

(54) DISTANCE MEASURING DEVICE AND METHOD FOR DETERMINING A DISTANCE

(75) Inventor: Gunther Trummer, Baiersdorf (DE)

(73) Assignee: Mikrowellen-Technologie und Sensoren GmbH, Ottobrunn (DE)

( * ) Notice: Subject to any disclaimer, the term of this patent is extended or adjusted under 35 U.S.C. 154(b) by 0 days.

(21) Appl. No.: 09/463,806

(22) PCT Filed: Jul. 31, 1998

(86) PCT No.: PCT/EP98/04815

§ 371 (c)(1), (2), (4) Date: Jun. 29, 2000

(87) PCT Pub. No.: WO99/06788

PCT Pub. Date: Feb. 11, 1999

(30) Foreign Application Priority Data

Jul. 31, 1997 (DE) ........................................ 197 33 109
Feb. 23, 1998 (DE) ........................................ 198 07 593

(51) Int. Cl.[7] ................................................ G01R 27/04
(52) U.S. Cl. ....................................................... 324/635
(58) Field of Search ................................ 324/633, 635, 324/636; 73/514.31, 514.16; 333/227, 230, 231, 232; 257/664; 331/9, 97

(56) References Cited

U.S. PATENT DOCUMENTS 3,522,527 A 8/1970 Williams et al.
3,628,136 A 12/1971 Jonas
4,211,987 A 7/1980 Pan
4,781,063 A 11/1988 Osaki et al.
4,845,422 A * 7/1989 Damon .................... 324/585 R
4,868,488 A * 9/1989 Schmall .................. 324/58.5 R
4,890,054 A 12/1989 Maeno et al.
4,943,778 A 7/1990 Osake
5,023,618 A 6/1991 Reits
5,325,095 A 6/1994 Vadnais et al.
5,504,490 A 4/1996 Brendle et al.
5,596,325 A 1/1997 Maas

FOREIGN PATENT DOCUMENTS

DE 40 40 084 A1 6/1992
DE 195 43 179 A1 5/1997
DE 198 33 220 A1 6/1999
EP 0 121 824 A1 3/1983
EP 0 558 759 A1 9/1993
GB 1331525 9/1973
JP 57197734 5/1984
JP 07030584 8/1996
SU 1103098 7/1984

* cited by examiner

*Primary Examiner*—N. Le
*Assistant Examiner*—Etienne P LeRoux
(74) *Attorney, Agent, or Firm*—Jenkens & Wilson, P.A.

(57) ABSTRACT

Described is a distance-measuring device and a method for determining a distance, which uses a sensor in the form of a cavity resonator to continuously perform a distance determination and allows diverse possible uses.

36 Claims, 9 Drawing Sheets a) Bilateral b) Unilateral Integration a) Bilateral b) Unilateral Integration c) Lateral Integration d) External Arrangement "Integration Possibilities in the Cylinder"

Detection of Position of Rotary Drive, Rotation Angles of 0 to 360° a) Seat Valve b) Piston Slide Valve a) Absolute Pressure b) Relative or Differential Pressure

DISTANCE MEASURING DEVICE AND METHOD FOR DETERMINING A DISTANCE

The present invention relates to a distance-measuring device according to the preamble of claim 1 or 2.

Conventional distance-measuring devices preferably operate in the near range using inductive, capacitive or ultrasonic sensors. For a measurement with inductive sensors, the calibration curve must be established and also the material of an object to be measured must be known. Furthermore, the inductive sensors have a measuring range of, for example, 180°, so that two sensors located next to each other mutually influence each other and thus the calibration curves of the respective sensors can vary. Moreover, such sensors are available commercially only in embodiments that have a diameter greater than 4 mm (M4).

The disadvantage of a measurement with capacitive sensors is that the distance between the capacitor plates must be known exactly. Furthermore, the measurement is subject to influence by atmospheric humidity, general electromagnetic compatibilities or temperature. In order to be able to perform the measurement independently of those parameters it is necessary, depending on the requirement, to perform a reference measurement by means of which the interfering influence can then be eliminated.

Further known from U.S. Pat. No. 3,522,527 are two cavity resonators with which the distance to corresponding surfaces is measured, the distance and thus the thickness between the two surfaces being determined indirectly by placing the two cavity resonators opposite each other. To perform this measurement, each of the cavity resonators must have a separate sensor, which conventionally is connected to the cavity resonator in a complicated manner and hence is associated with a correspondingly large expense for equipment.

Hence the problem addressed by the present invention is to create a distance-measuring device for determining the distance which overcomes the above-cited disadvantages and allows a continuous determination of distance, easy handling and diverse possible uses.

That problem is solved with the device features of claim 1 or 2.

According to the invention, the sensor has a resonator with a coplanar slot coupling, and specifically in the form of a cavity resonator. With this measure the advantage is achieved that extremely small embodiments, for example <M4, are realizable and the possible uses are increased by a multiple. Owing to the basic geometry of a cavity resonator, small distances between several parallel sensors are possible, because the sensor has a laterally sharply limited measuring range and thus its measuring behavior is not influenced by parallel sensors. As a field of application it is conceivable that the distance-measuring device according to the invention could be used to detect the direction of moving objects or for a space-saving configuration, e.g., by means of parallel configuration.

The sensor according to the invention can also be used as a switch with which changes of the switching point are possible without any redimensioning or modification of the sensor element or addition of other electronic components. That achieves the advantage that the switching point can be adjusted to the specific requirements via software, for example.

The sensor according to the invention is also able to detect approaching conductive or dielectric objects and to measure the distance to the object within the micron range. This type of sensor can be used, for example, as a proximity switch for continuous measurement of the piston travel at the reversal point of pneumatic and hydraulic cylinders, of valve positions or for measurement of the extension of pressure membranes.

According to the invention, the measuring distance for conductive objects does not depend on the object's size if it is assumed that the object is at least as large as the diameter of the cavity resonator. Moreover, a measurement of distance to conductive and dielectric objects is generally possible.

If the sensor is used as a switch, then according to the invention a change of the switching point or a redimensioning or modification of the sensor element can be implemented in a simple manner. Since the switching point is adjustable via software, for example, there is the further advantage that multiple switching points can be input in a simple manner via suitable software, whereby one obtains a substantially more versatile range of uses, e.g., for detecting the sizes of parts, for different configurations of a machine, for detecting rotation angles via cams, etc. In contrast, as mentioned initially, very great effort is required to implement multiple switching points with inductive sensors.

Owing to the measurement method used in the distance-measuring device according to the invention, several switching points can also be connected to one another via a logic circuit, whereupon the measurement method operates continuously. For example, this is advantageous if three switching points are needed for the interrogation of a rotary cylinder.

Owing to its compact construction, one base element is usable in all standard housing types for switching distances of, for example, 0.6, 0.8, 1.0, 1.5, 2.0 or 5 mm, resulting in cost savings and hence reduced logistic requirements.

Alternatively, the distance-measuring device, specifically the resonator, can have a microstrip line for the in-coupling, which is used especially when it is advantageous for the evaluation electronics unit to be offset from the resonator, e.g., for applications in which a high temperature occurs.

Other advantageous embodiments are the subject of other subclaims.

It has turned out to be especially advantageous if the resonator is a radio frequency resonator whose resonance frequency lies between 1 and 100 GHz depending on the object, and preferably between 20 and 30 GHz. For certain applications it is further advantageous to tune the radio frequency resonator with a frequency between 22 and 24 GHz as well as 24 and 26 GHz or any other range, with a bandwidth of preferably 2 GHz or with a bandwidth of approximately 10 percent of the utilized frequency.

If the distance-measuring device according to the invention is equipped with a resonator which has a cylindrical shape and whose base surface facing toward the object is open, i.e., not metallized, then the resonance frequency is not dependent on temperature.

If the cavity resonator according to claim 5 is filled, for example, with a dielectric, preferably $Al_2O_3$, then the entire distance-measuring device can be small.

Here it should be pointed out that it is generally advantageous if the measuring range is as large as possible, but that means that the dielectric constant $\epsilon$ should be small. Ideally, that is achieved in that the cavity resonator is unfilled, i.e., contains no dielectric. But a disadvantage of that arrangement is that the cavity resonator then has to be large in order to obtain a large measuring range. But with dielectric the cavity resonator is small for approximatelythe same measuring range. However, it must be made certain that the dielectric constant of the dielectric is not too large (preferably ≦10), since otherwise the losses increase and the range of distances decreases. If a ceramic is used as dielectric, the further advantage is achieved that applications requiring resistance to temperatures of up to 1000° C. are possible and use for highly dynamic measurements of pressure in internal-combustion engines is possible. Thus the distance device according to the invention is resistant to pressure and hence also usable in hydraulic cylinders, for example.

It has proven advantageous that, according to claim 8, only the surface of the dielectric—with the exception of the base surface facing toward the object—is coated or sputter-coated with a thin layer of gold, so that the temperature function depends only on the temperature coefficient of the ceramic, for example, and not on the housing.

The sensor element consists of a ceramic and a metal housing and can be connected to the evaluation electronics unit via a suitable radiofrequency line, e.g., a waveguide. Because of that, it is possible to use the sensor element for high-temperature applications at up to approximately 1000° C., e.g., in internal combustion engines.

Independently of the measurement of a distance, the distance-measuring device can also be used advantageously for the measurement of other physical quantities such as pressure, force or mass and of material properties such as the loss factor of dielectric materials. For that purpose, the open side of the cavity resonator is closed with a sample of the material at a fixed distance to it. For a pressure sensor, preferably a piezoelectric ceramic disk would be mounted at distance zero. If a pressure, a force or a mass now acts on the piezoelectric ceramic, then the latter's dielectric constant changes. The change of the dielectric constant results in a shift of the resonance frequency. By determining the resonance frequency with the device features from claim 1 or 2, the pressure, force or mass on the piezoelectric ceramic can be determined.

If, according to claim 10, the dielectric is inserted into a metal housing made preferably of Kovar or titanium, a suitable high-temperature application is conceivable. Then the cavity resonator in the unfilled state has a high measuring accuracy even at high temperatures, and in the filled state the expansion as such is exactly controllable.

If the distance-measuring device according to claim 11, and specifically the resonator, has a coplanar slot coupling on the side facing away from the object, that arrangement ensures that the in-coupling of the resonance frequency can occur simply and at a suitable point.

Depending on the operating mode of the distance-measuring device, the coplanar slot coupling can consist of one coupling slot each for the transmitter and receiver according to claim 12, which are disposed circularly and which corresponds to a transmission mode, or the coplanar slot coupling consists of one coupling slot for the transmitter and receiver, which corresponds to operation in a reflection mode.

If, according to claim 14, the distance-measuring device is operated in the $H_{0np}$ mode, preferably in the $H_{011}$ mode, then the resonator can oscillate within a large range of resonance frequencies in which no other modes are co-excited, so as to keep the measuring accuracy high. Furthermore, excitation of the $H_{011}$ mode offers the advantage that then no wall currents flow over the edges between the cylindrical surface and the end surface.

Other advantageous embodiments of the invention are the subject of the other subclaims.

Specific embodiments of the present invention will be illustrated with reference to the appended drawings.

Figure 13A:
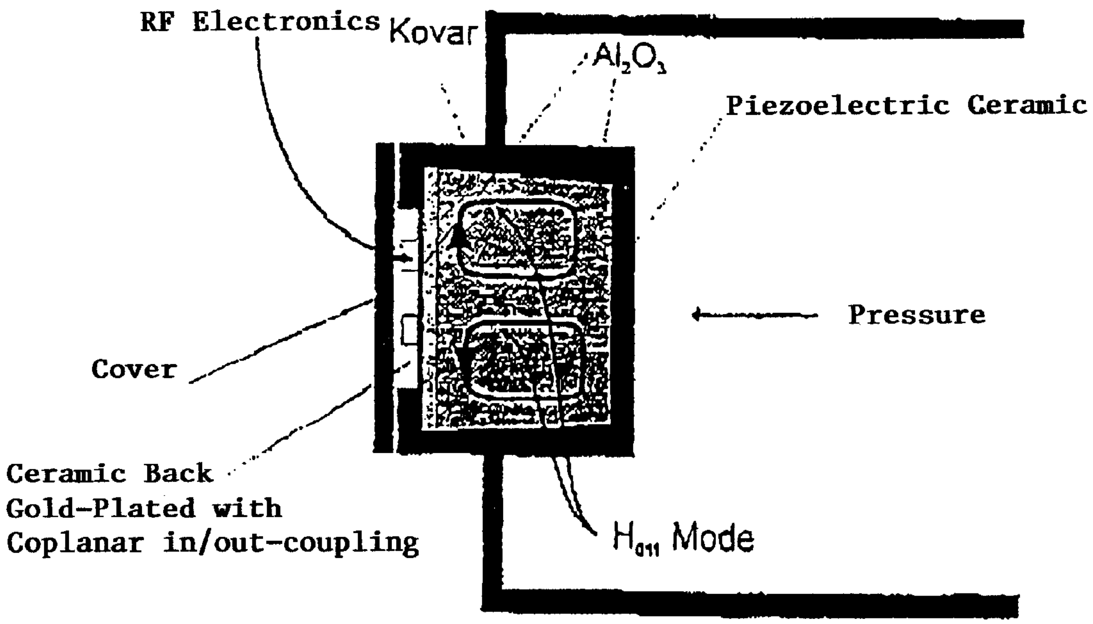
Figure 13B:
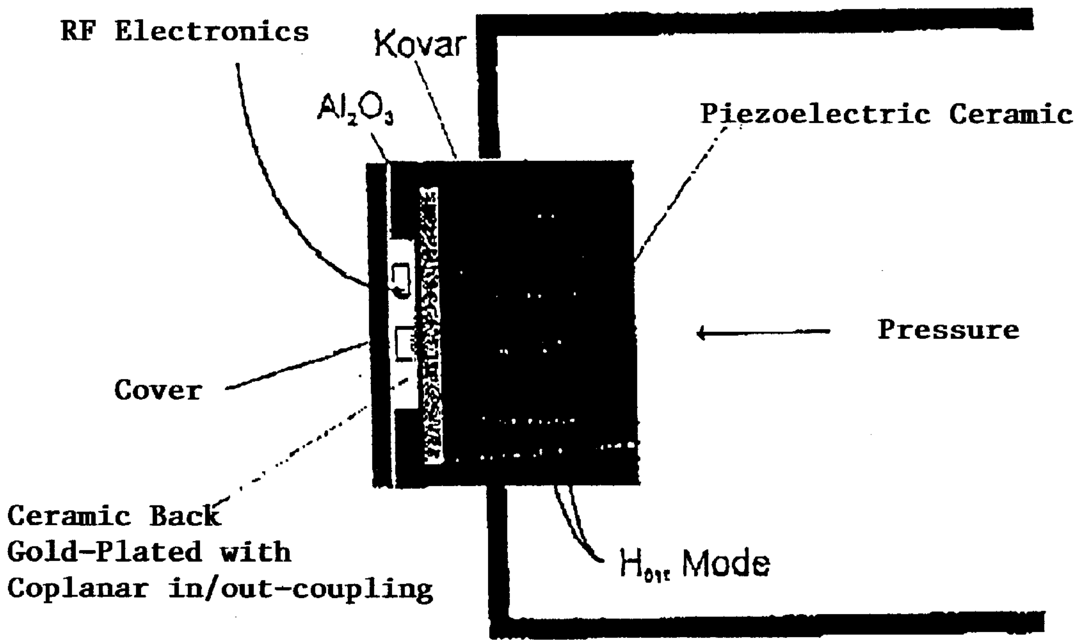
Figure 14:
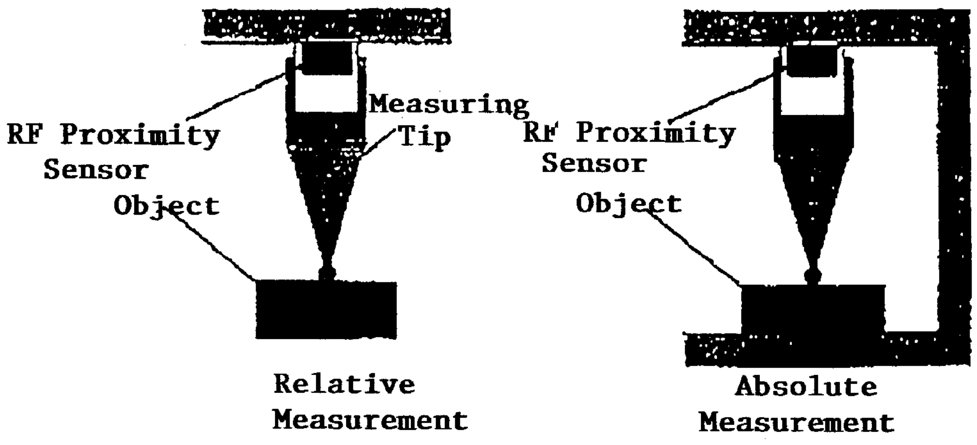
Figure 15:
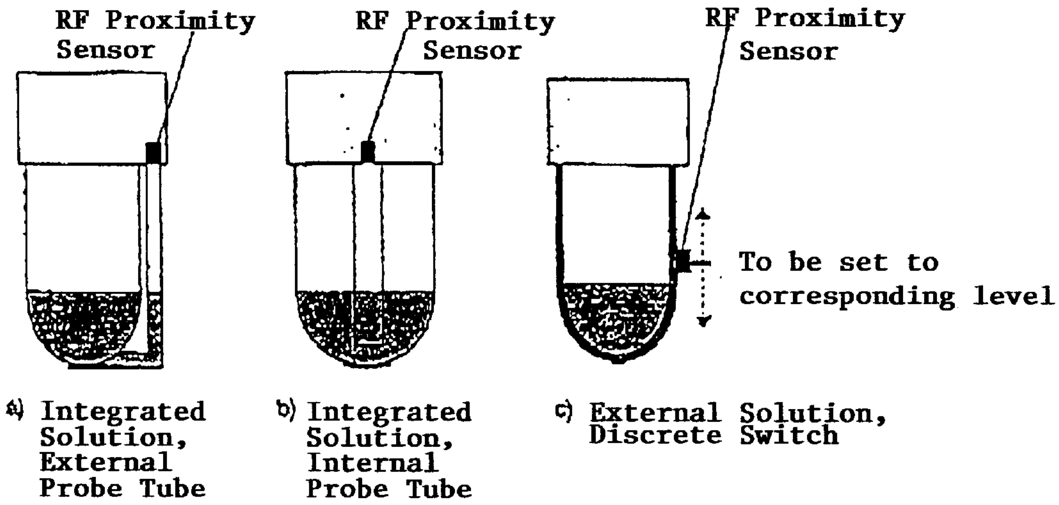

FIGS. 13*a*, 13*b* shows another possible application, e.g., a pressure measurement by changing the dielectric constant under a mechanical load;

FIG. 14 shows another possible application of the distance-measuring device according to the invention, e.g., for surveying an object;

FIG. 15 shows another possible application of the distance-measuring device according to the invention, e.g., for a liquid-level sensor.

Figure 1:
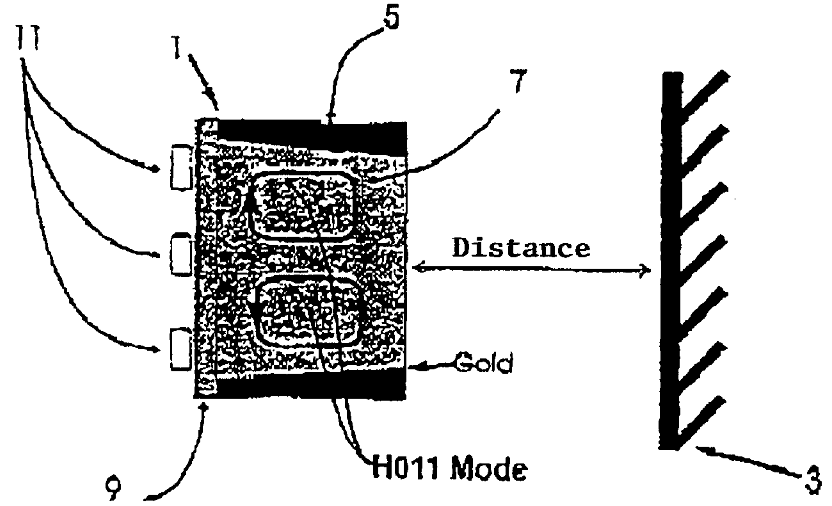
FIG. 1 shows a sectional view of the distance-measuring device according to the invention.

As is shown in FIG. 1, the distance-measuring device has a resonator in the form of a cavity resonator 1 which is formed from a metal housing 5, preferably made of titanium or Kovar. This metal housing, which preferably is tapered, preferably has incorporated into it a dielectric 7, e.g., in the form of a ceramic, e.g., $Al_2O_3$ or a fluid material, preferably air or inert gas such as, e.g., noble gases or nitrogen. As is shown in FIG. 1, the ceramic can be inserted into the housing. The dielectric 7 itself is metallized, e.g., gold-plated, except on the open side directed toward the object. This achieves the advantage that the temperature depends only on the temperature coefficient of the dielectric 7 and not on that of the metal housing.

Positioned on the back of the cavity resonator is a substrate 9, e.g., also ceramic, as carrier for the in-coupling mimic. e.g., in the form of a coplanar slot coupling or a microstrip line, and the active components of the evaluation electronics unit and in the form of the radiofrequency electronics unit. The electromagnetic wave is coupled in via this arrangement. This back can also be gold plated and carries the entire radiofrequency electronics unit 11.

Owing to the use of the dielectric 7, the geometric dimensions of the cavity resonator can be reduced while maintaining the same transmit frequency. As is generally known, the resonance frequency $f_r$ of a cylindrical $H_{mnp}$ resonator can be determined from $\epsilon$, $\mu$, the $n^{th}$ zero of the derivative of the Bessel function of $m^{th}$ order and the diameter D and length L of the cavity resonator. The functional relation between $\epsilon\mu(f_r D)^2$ and $(D/L)^2$ can be clearly illustrated in a so-called mode chart as in FIG. 5. From this mode chart it is also relatively easy to identify regions in which no other modes can be propagated. By isolating the resonator end surface from the cylindrical surface, which corresponds to an open resonator with $H_{0np}$ modes, a further mode selection can be made. It has proven to be especially advantageous for the cavity resonator to be designed so that the $H_{0np}$ modes, preferably the $H_{011}$ mode, can be propagated, since then no wall currents flow over the edges between the cylindrical surface and the end surface. Corresponding to the line of the $H_{011}$ mode in FIG. 5, it is only necessary to look for a section near which no characteristic line of other modes occurs, so that no other mode is excited when the mechanical dimensions of the resonator vary in certain ways and when the frequency is tuned.

Figure 2:
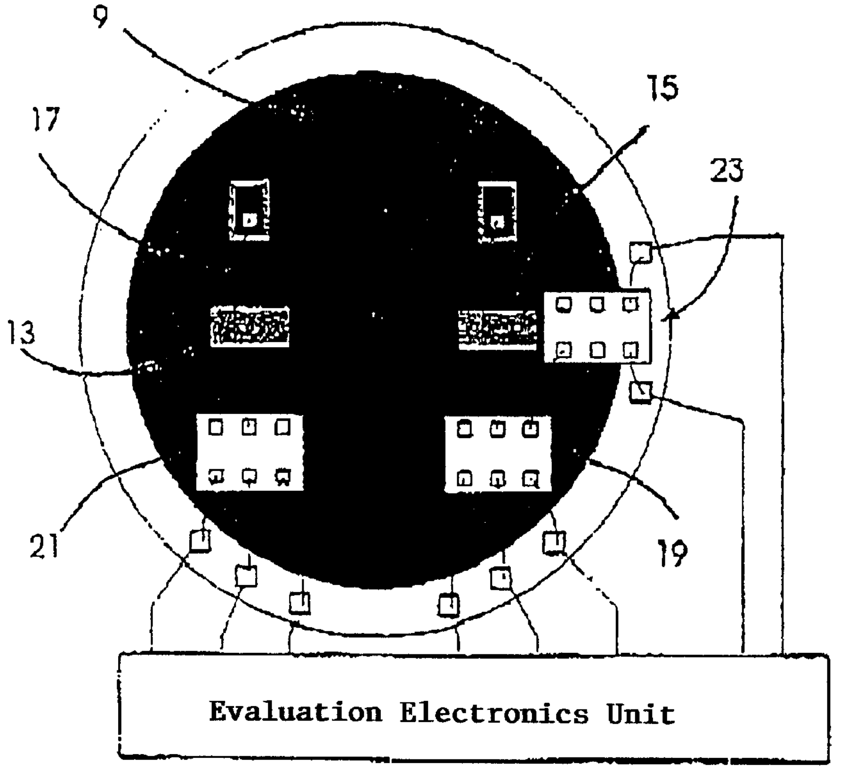
FIG. 2 shows a rear view of the distance-measuring device of FIG. 1 according to the invention.

The back of the cavity resonator of FIG. 1 is shown in FIG. 2. The coupling of the electromagnetic wave into the cavity resonator, which in this Figure corresponds to a coplanar slot coupling, can be illustrated more clearly by means of this Figure. The back of the cavity resonator is provided with a substrate 9, preferably ceramic. The outer surface of the substrate 9 is preferably gold-plated. Only the in-coupling slots 13 and 15 remain recessed in the cavity resonator 1. At the points of maximum field strength, e.g., semiradius of the dielectric 7, the electromagnetic wave is fed in via the slot coupling. The size of the coupling slots 13 and 15 depends on the dimensions of the dielectric 7. For example, if the diameter of the dielectric 7 is 6 mm, the size is approximately 0.3 mm by 0.2 mm. The electromagnetic wave itself is brought to the slot via a coplanar 50Ω line and is coupled into the slot via a bond wire 17, e.g., 17.5 $\mu$m gold wire 17. To achieve optimal matching, the bond wire 17 can be terminated on the opposite side with a line structure which is insulated.

With this arrangement the cavity resonator 1 can be operated both in the transmission mode and in the reflection mode. If the cavity resonator 1 is operated in the transmission mode, then the electromagnetic wave is coupled out at a second coupling slot 15 with the already described coplanar out-coupling and in-coupling. In the reflection mode, that output is terminated with 50Ω. As already mentioned above, if the diameter of the dielectric is smaller, then a microstrip line in-coupling can be used advantageously. Also provided on the back is, e.g., an oscillator 19, e.g., a voltage-controlled oscillator (VCO), a detection diode 21 and a frequency divider 23, which are connected to an evaluation electronics unit.

Figure 3:
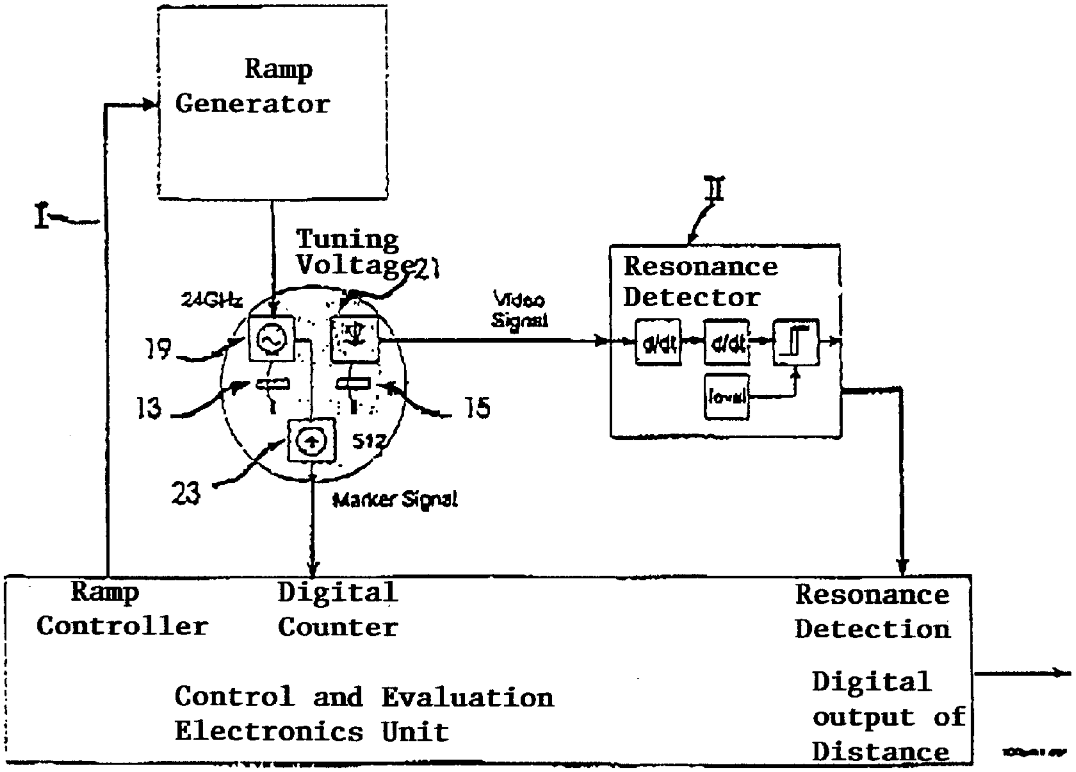
FIG. 3 shows a block diagram of the circuit for the distance-measuring device according to the invention.

FIG. 3 shows a general diagram or block diagram of the operation of an advantageous embodiment of the distance-measuring device according to the application. Starting from a control and evaluation electronics unit, a ramp generator is driven via a ramp controller, whereby the frequency of the transmit branch I is tuned. At the same time, via the receive branch II a resonance detector, which is connected to the detector diode and consists of a two-stage differentiator and a comparator, continuously monitors the second derivative to determine whether a video signal picked off from the receive branch II indicates a resonance. The resonance is detectable from the fact that it differs from a nonresonance by a high steepness in a video signal from the receive branch with increasing oscillator frequency (see FIG. 4). As soon as a resonance is detected by the control and evaluation electronics unit, an integrator which controls the ramp controller stops, whereupon the oscillator frequency divided down by the frequency divider 23 is determined by a digital counter in the evaluation electronics unit.

In this manner the resonance frequency in the cavity resonator is measured. Since the resonance frequency in the cavity resonator depends on the distance of the object (see FIG. 5), the distance can be inferred directly from a determination of the resonance frequency. The new resonance frequency is determined by varying the transmit frequency until the resonance frequency and the transmit frequency coincide. At that time, a power dip occurs at the detector diode. Parallel with that, the transmit frequency is determined at the output of the frequency divider 23. The accuracy of the measurement of the distance to the object depends on how quickly and with what accuracy the transmit frequency is determined. Determination of the distance with an accuracy of 1$\mu$m at a typical distance of 0.5 mm requires an accuracy of at least 0.5 MHz in the frequency determination at 26 GHz.

Figure 4:
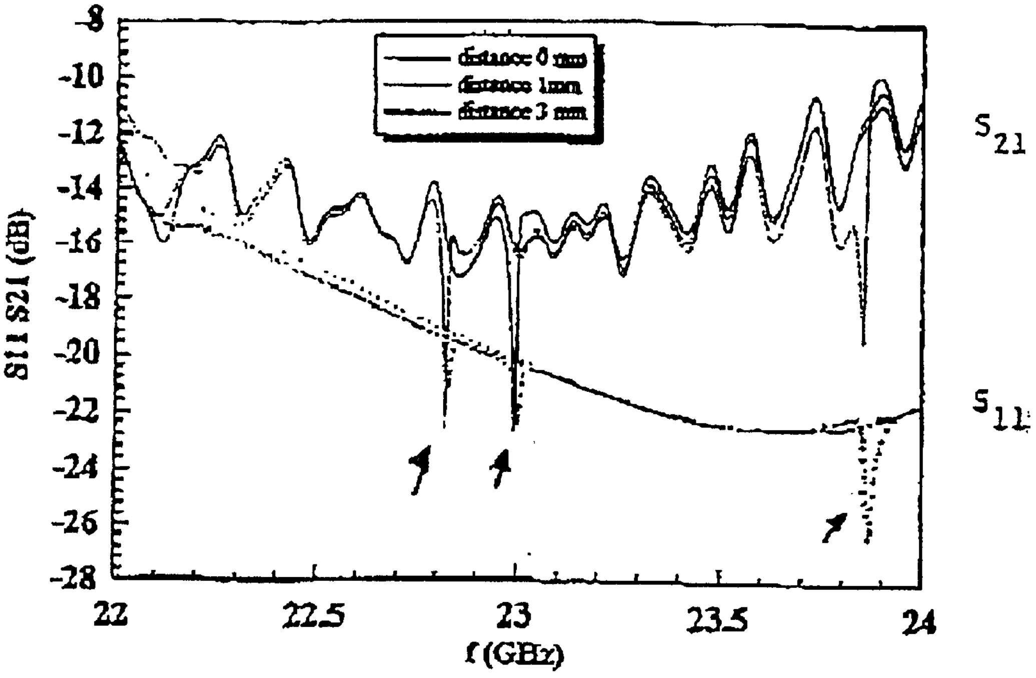
FIG. 4 shows the reflection and transmission behavior of the distance-measuring device according to the invention as a function of resonance frequency for various distances to the object.
Figure 5:
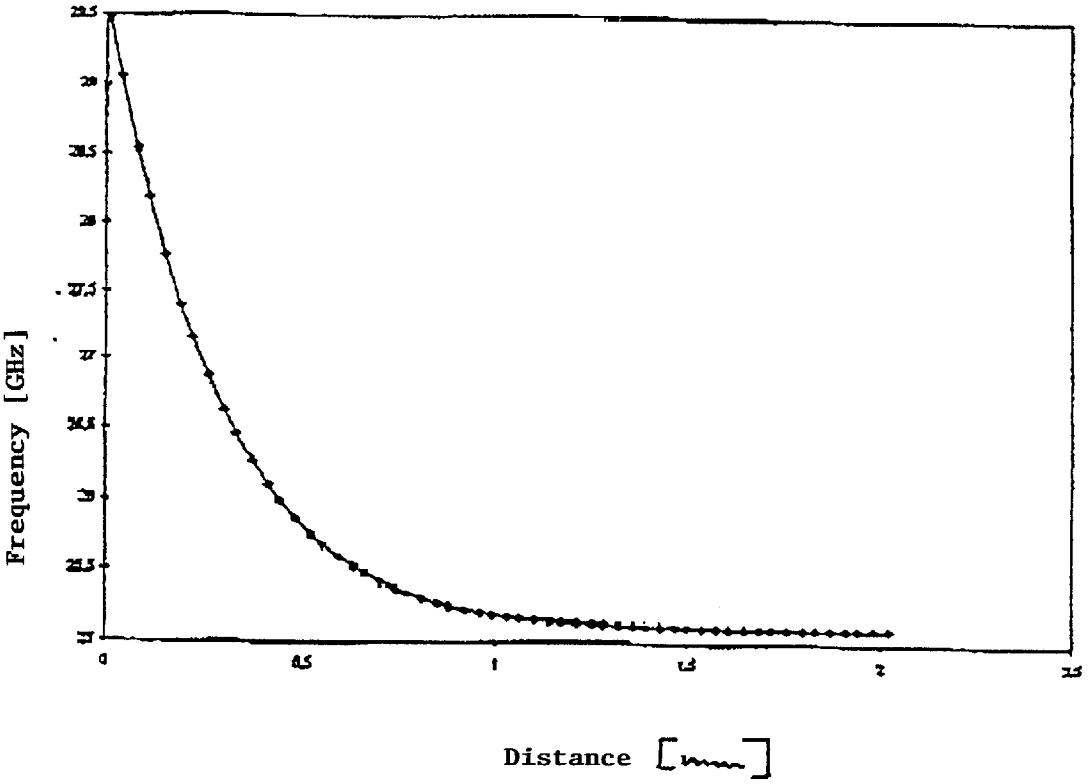
FIG. 5 shows a diagram of the dependence of the resonance frequency on the distance to the object.

The measurement values illustrated in FIGS. 4 and 5 shall be used to illustrate the operation of the distance-measuring device according to the application.

As can be clearly seen in FIG. 4, the reflection and transmission characteristics, which are depicted as functions of the resonance frequency for different distances to the object, exhibit distinct dips in the signal which occur upon reaching the resonance frequency for a fixed distance to the object. Moreover, one can again recognize a clear coincidence of the signal dips between the reflection and transmission characteristics.

The dependence of the distance on the resonance frequency is illustrated in FIG. 5. It is clearly recognizable that a clearer shift of the resonance frequency occurs for smaller distances, which [verb missing] the measuring accuracy especially for objects which are positioned just in front of the cavity resonator. It should be noted that the resonance frequency decreases with increasing distance to the object. In contrast, for dielectric objects the resonance frequency increases with increasing distance to the object. Hence the directional change of the resonance frequency depends on the dielectric constant of the object. According to the invention, this effect can be exploited to measure or determine the physical quantities of pressure, force and mass. For that purpose, the open side of the cavity resonator is preferably closed with a piezoelectric ceramic. If a pressure, force or mass then acts on the piezoelectric ceramic, its dielectric constant changes correspondingly. The change of the dielectric constant shifts the resonance frequency of the cavity resonator. Depending on the dielectric constant, one then moves along the y-axis (x=0) in FIG. 5.

Figure 6:
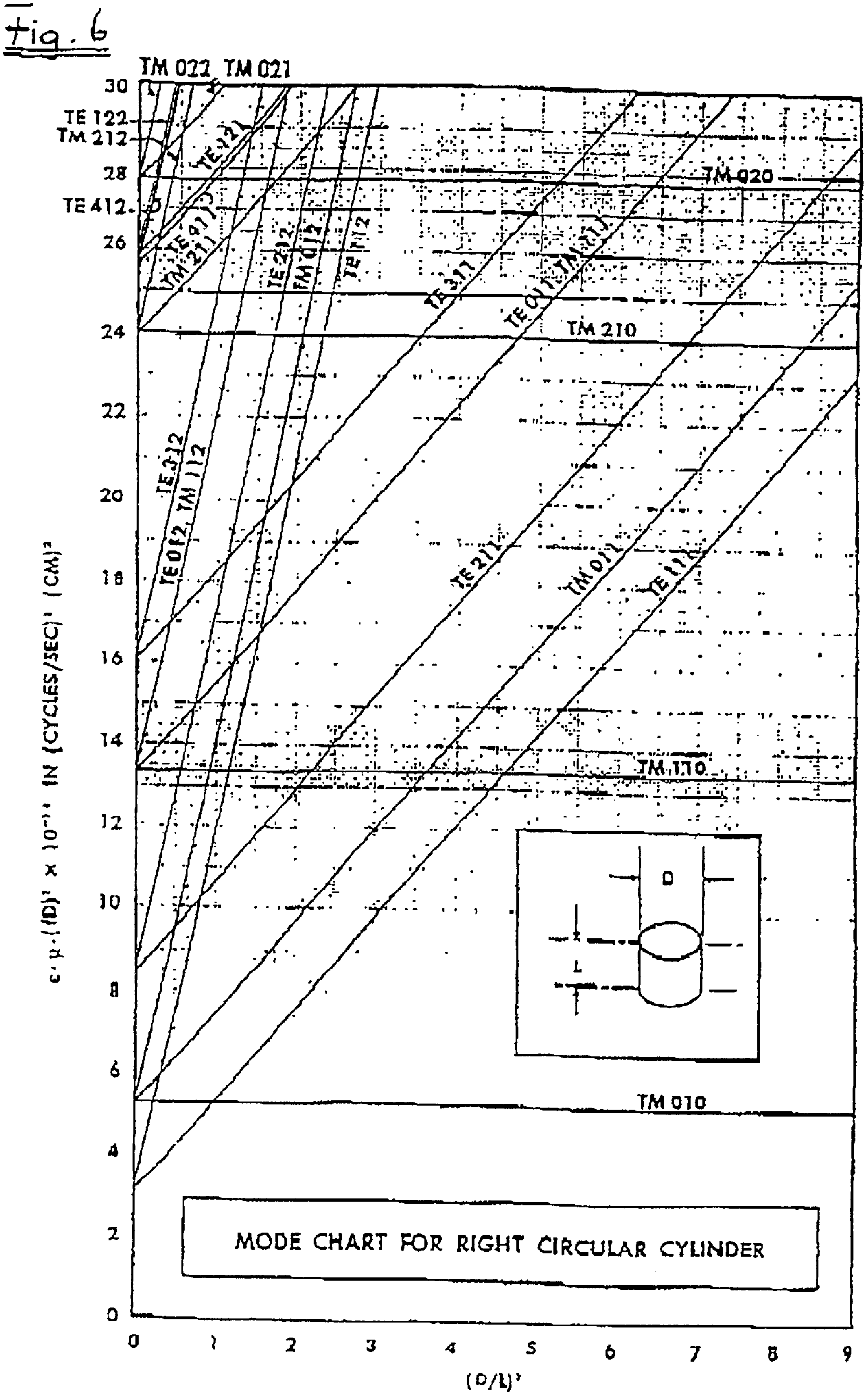
FIG. 6 shows the mode characteristic of a circular cylinder for the dimensioning of the resonator of the distance-measuring device according to the invention.

FIG. 6 shows a general overview of the modes to be excited in a circular cylinder. Depending on the cylinder's size, the appropriate mode (TM=E field component and TE=H field component) can be selected by means of this diagram.

Figure 7:
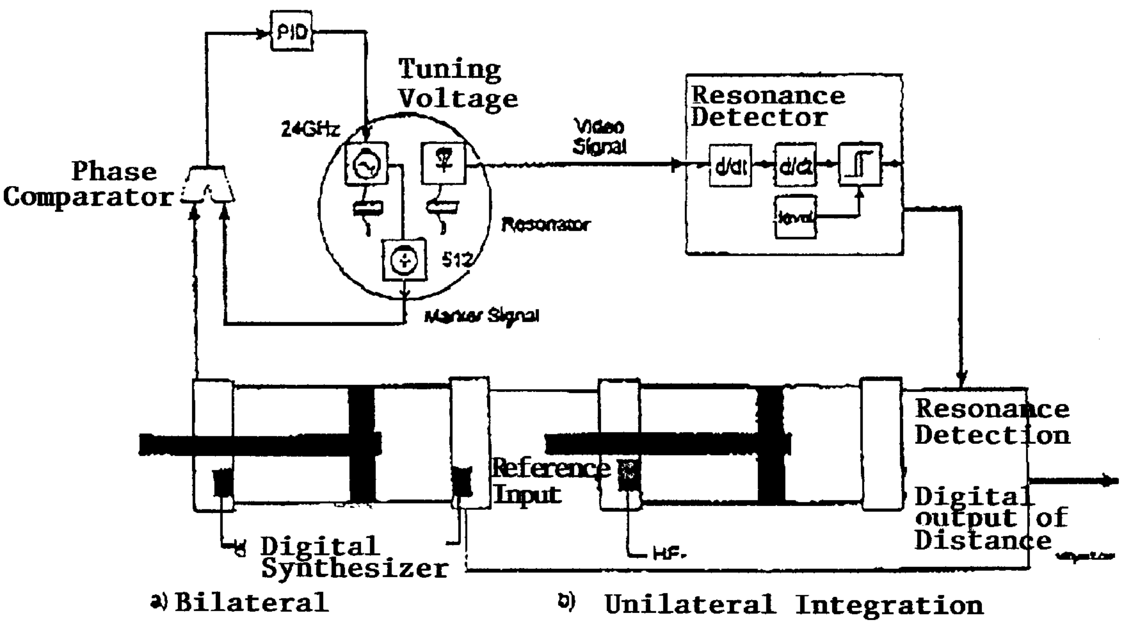
FIG. 7 shows another block diagram for another embodiment of the circuit of the distance-measuring device according to the invention.

To determine distances within the micron range, one can use another embodiment of the evaluation electronics unit in the distance-measuring device according to the application, which is explained in more detail with reference to the block circuit diagram in FIG. 7.

The main difference compared to the distance determination described above is that the divided-down oscillator frequency is not used directly as the result parameter. Instead, it is used in a frequency and phase control loop, a so-called phase-locked loop (PLL). The setpoint frequency is adjusted via a direct digital synthesizer (DDS) to a frequency which enters the control loop as reference input. If the video signal from the receive branch II satisfies the resonance condition, the resonance frequency and thus the distance to the target is already known in a microcontroller contained in the evaluation electronics unit. By eliminating the measuring time for the oscillator frequency and the use of a resonance sequence algorithm in a microcontroller in the evaluation electronics unit, the cycle time can be clearly shortened and thus the measuring accuracy can be substantially enhanced.

A few possible fields of use of the distance-measuring device according to the application using a radiofrequency proximity sensor shall be described in the following.

Figure 8:
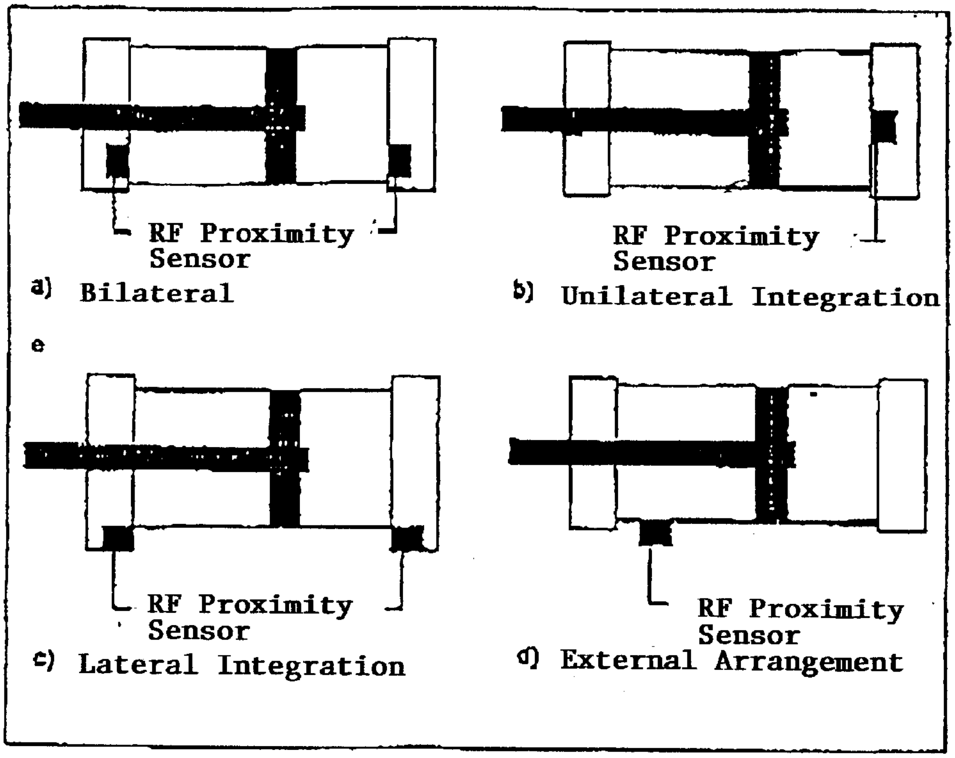
FIG. 8 shows various positionings of a special application for the distance-measuring device according to the invention.

A. Detection of Piston Position:

The possible sensor arrangements for interrogating the piston position of a linear cylinder drive with the radiofrequency proximity sensor of the distance-measuring device according to the application are shown in FIG. 8.

Figure 9:
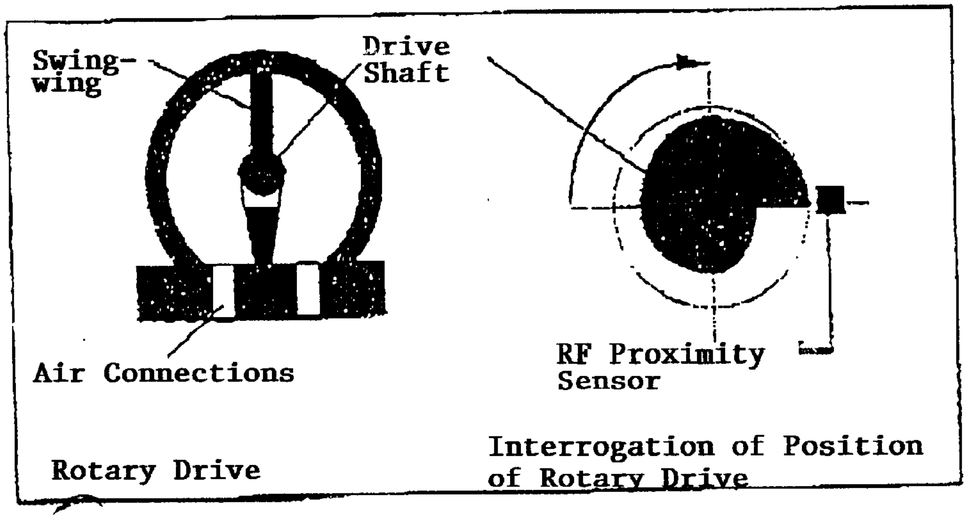
FIG. 9 shows another possible application of the distance-measuring device according to the invention.

A possible sensor arrangement for interrogating the position of a rotary drive with the radiofrequency proximity sensor is shown for a rotary drive in FIG. 9. Because such a radiofrequency proximity switch has an extremely flat construction, several positions can be implemented with the sensor element when there are several switching points. For example, the adjustment can be made with a potentiometer or a teach-in logic.

B. Detection of the Piston Position of a Shock Absorber

Figure 10:
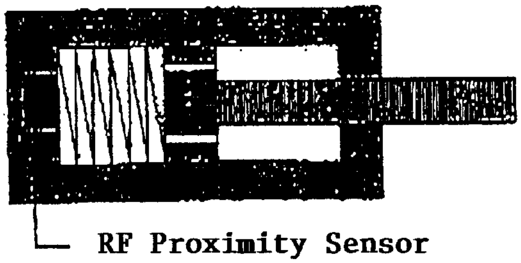
FIG. 10 shows another possible application of the distance-measuring device according to the invention, e.g., for a shock-absorber interrogation.

The construction of a shock absorber with a built-in radio frequency proximity sensor is illustrated schematically in FIG. 10.

Figure 11:
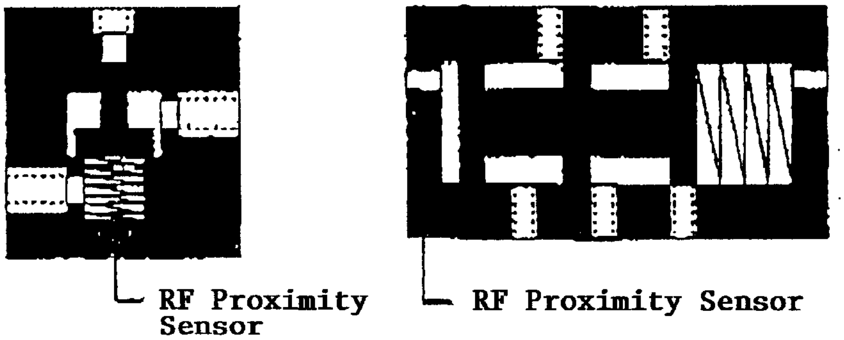
FIG. 11 shows a possible application for the detection of a piston position in a valve.

In general, the principle according to the invention can also be applied to valves with moving mechanical parts (see FIG. 11), in which case the valve flow capabilities are controlled by the position change of the mechanical part. Heretofore, position interrogations in the pneumatics field were performed by means of sensors that are sensitive to magnetic fields and react to permanent magnets on the piston or tappet of the valve. But it turns out that for cost-effective solutions only discrete ranges of position can be detected by a sensor that is mounted at a fixed place and is aligned with the positions being detected. In the hydraulics field, a magnetic interrogation has only limited feasibility because of the ferromagnetic materials that are usually used.

C. Pressure Measurement by Detection of the Membrane Excursion

Figure 12:
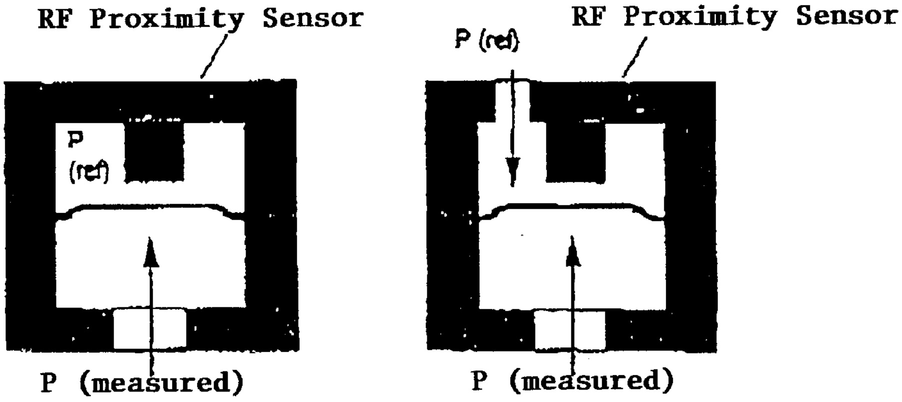
FIG. 12 shows another possible application, e.g., a pressure measurement by detecting the excursion of a membrane.

Different pressure measurements, i.e., absolute pressure and relative or differential pressure, are illustrated in FIG. 12. In this special exemplary embodiment, the pressure is determined by detecting the distance to a membrane which is moving toward and away from the RF proximity sensor. In comparison to currently used systems, e.g., piezoresistive strip strain gauges or silicon elements, the device according to the application has the advantage that the sensitive electronics lie outside the pressure transducer.

D. Pressure Measurement by Change of the Dielectric Constant Under Mechanical Loading, Preferably of a Piezoelectric Ceramic For a pressure measurement at very high pressures, an indirect determination of the pressure via a displacement measurement, e.g., by means of a membrane moving toward and away, is not suitable because of the forces that occur.

In this embodiment, the measurement of the physical quantity “distance” is replaced by the material property “pressure-dependent dielectric constant”. Here the cavity resonator filled with dielectric is closed on the open side, preferably with a piezoelectric ceramic (see FIG. 13). The result of this change is that the resonance frequency is shifted. The evaluation of this frequency change and its conversion into the corresponding pressure change is done preferably by the method described in FIG. 3 and FIG. 7.

In this exemplary embodiment, the entire cavity of the resonator can be filled with piezoelectric ceramic (see FIG. 13*b*).

A major advantage of this arrangement in comparison to conventional measuring methods with strip strain gauges or capacitive pressure transducers is its high mechanical stability. The piezoelectric ceramic is mechanically completely braced by the resonator, especially when the resonator housing is tapered and the internally supported ceramic provides the necessary stability for high-pressure applications.

Further advantages relative to conventional measuring methods are that the alignment and high precision required for installation in the pressure transducer are eliminated and the sensitive electronics are located outside the pressure transducer.

E. Object Surveying

For the object surveying shown in FIG. 14, a measurement is made of the movement of the measuring tip which is moved back and forth by an object. Using the distance-measuring device according to the application, measurements can also be made thereby within the micron range.

F. Liquid-level Sensor or Monitor

The possible application illustrated in FIG. 15 relates, for example, to a liquid-level sensor. Different installation locations of the radiofrequency proximity sensor are illustrated in FIGS. 15*a, b* and *c*. In the cases of FIGS. 15*a* and 15*b*, the distance of the level to be measured is measured in a separate probe tube which is disposed externally or internally. In the arrangement in FIG. 15*c*, the radiofrequency proximity sensor is used externally for monitoring at a level corresponding to the maximum liquid level. In an advantageous manner this ensures the monitoring of a maximum liquid level or a preset detection range. A switch signal is indicated if the level falls below the maximum liquid level or if liquid emerges outside the set detection range.

In contrast, if the radiofrequency proximity switch is used externally as a liquid-level switch, the switching function can be used to indicate when the liquid level goes above or below a preset liquid level. This external arrangement can eliminate the need for an expensive integration. The system in FIG. 14*c* can be used for adaptation to existing maintenance devices with RF-transparent shells.

At this point it should be pointed out that the distance-measuring device according to the application can be used not only in the fields indicated above but wherever a distance-measuring device down to the micron range is required.

What is claimed is:

1. Distance-measuring device with a sensor and an evaluation electronics unit for measuring distance to an object, wherein the sensor has a resonator in the form of a cavity resonator with a resonator housing, the resonator having a first surface for facing the object, a second surface being metallized, and a coplanar slot coupling with in-coupling line, and the in-coupling line being terminated at the resonator housing.

2. Distance-measuring device with a sensor and an evaluation electronics unit for measuring distance to an object, wherein the sensor has a resonator in the form of a cavity resonator with a resonator housing, the resonator having a first surface for facing the object, a second surface being metallized, and a microstrip line for the in-coupling, the microstrip line being terminated at the resonator housing.

3. Distance-measuring device according to claim 1, wherein the resonator has a radiofrequency resonator whose resonance frequency is between 1 and 100 GHz.

4. Distance-measuring device according to claim 1, wherein the cavity resonator is cylindrical in shape, wherein the first surface is on a first end of the cylindrically-shaped resonator.

5. Distance-measuring device according to claim 1, wherein the cavity resonator is filled with a fluid material selected from the group of air and inert gas.

6. Distance-measuring device according to claim 1, characterized in that the cavity resonator is filled with a dielectric including $Al_2O_3$.

7. Distance-measuring device according to claim 6. wherein the cavity includes an attached piezoelectric ceramic, adapted to change its dielectric constant when loaded with pressure.

8. Distance-measuring device according to claim 6, wherein the cavity resonator is filled with dielectric material including piezoelectric ceramic, and the dielectric material has the property of changing the dielectric constant when loaded with pressure.

9. Distance-measuring device according to claim 6, wherein second surface is coated with a thin layer of gold.

10. Distance-measuring device according to claim 1 wherein the dielectric is inserted into a metal housing.

11. Distance-measuring device according to claim 1, wherein the coplanar slot coupling is disposed on a side of the resonator facing away from the object.

12. Distance-measuring device according to claim 11, wherein the coplanar slot coupling includes one coupling slot for each of a transmitter and receiver (transmission mode), the transmitter and receiver being disposed circularly.

13. Distance-measuring device according to claim 11, wherein the coplanar slot coupling includes one coupling slot for a transmitter and receiver (reflection mode).

14. Distance-measuring device according to claim 1, wherein the in-coupling line and the resonator allow as wave mode the $H_{0np}$ modes.

15. Distance-measuring device according to claim 1, wherein the sensor includes a radio frequency electronics unit having a transmit branch and a receive branch.

16. Distance-measuring device according to claim 15, wherein the transmit branch consists of an oscillator.

17. Distance-measuring device according to claim 15, wherein the receive branch consists of at least one radiofrequency diode.

18. Distance-measuring device according to claim 16, wherein the oscillator frequency follows a setpoint frequency (reference input) via a closed control loop.

19. Distance-measuring device according to claim 18, wherein the control loop (PLL: phase-locked loop) includes at least one frequency divider, a phase discriminator and a low-pass filter, and the setpoint frequency is prescribed via a DDS (direct digital synthesizer) (dynamic frequency control or determination).

20. Distance-measuring device according to claim 18, wherein the control loop consists of at least one frequency divider and is closed via a frequency counter, microcontroller and digital-to-analog converter (static frequency control or determination).

21. Method for determining a distance to an object, comprising:

(a) providing a sensor and an evaluation electronics unit, the sensor including a cavity resonator with a resonator housing, the resonator having a first surface for facing the object. a second surface being metallized, and a coplanar slot coupling with in-coupling line, the in-coupling line being terminated at the resonator housing; and (b) determining the resonance frequency of the cavity resonator in order to determine the distance to the object.

22. Method according to claim 21, wherein determining the resonance frequency includes detuning the transmit frequency of an oscillator in the transmit branch until a power dip at a resonance is found in the receive branch.

23. Method according to claim 22, wherein the transmit frequency of the oscillator is detuned by a ramp controller and a ramp generator.

24. Method according to claim 22, wherein the transmit frequency of the oscillator is adjusted via a direct digital synthesizer (DDS).

25. Method according to claim 21, including determining the resonance frequency in order to determine one selected from the group of pressure, force and mass on the object at zero distance to the object.

26. A device for measuring the distance to a conductive object, comprising:

(a) a resonator including a housing and a dielectric for detecting generating an electromagnetic wave in the presence of the conductive object, having a first surface for facing the object for measurement and a second surface being metallized; and (b) an electronics unit attached to resonator and including a substrate adapted to couple electromagnetic waves generated by the resonator.

27. The device of claim 1, wherein the resonator is cylindrical in shape, wherein the first surface is on an end of the cylindrically-shaped resonator.

28. The device of claim 1, wherein the resonator has a resonance frequency of between 20 and 30 GHz.

29. The device of claim 1, wherein the resonator is a cavity resonator including a fluid material selected from the group of air and inert gas.

30. The device of claim 1, wherein the resonator is a cavity resonator including a dielectric material adapted to change the dielectric constant when loaded with pressure.

31. The device of claim 30, wherein the cavity resonator includes a dielectric material having the property of changing the dielectric constant when loaded with pressure.

32. The device of claim 1, wherein the second surface is metallized with gold.

33. The device of claim 1. wherein the electronics unit includes a coplanar slot coupling having an in-coupling line, the in-coupling line being terminated at the housing.

34. The device of claim 1, wherein the in-coupling line and the resonator are adapted to allow as the wave mode the $H_{0np}$ modes.

35. The device of claim 1, wherein the electronics unit includes a microstrip line for the in-coupling, the microstrip line being terminated at the resonator housing.

36. The device of claim 1, wherein the electronics unit includes a piezoelectric ceramic material.

* * * * *

UNITED STATES PATENT AND TRADEMARK OFFICE

CERTIFICATE OF CORRECTION

PATENT NO. : 6,445,191 B1
DATED : September 3, 2002
INVENTOR(S) : Gunther Trummer It is certified that error appears in the above-identified patent and that said Letters Patent is hereby corrected as shown below:

Title page,
Item [86], Sect. 371 Date replace "Jun. 29, 2000" with -- Jan 28, 2000 --.

Signed and Sealed this

Seventh Day of January, 2003

JAMES E. ROGAN
*Director of the United States Patent and Trademark Office*